United States Patent [19]

Lund et al.

[11] Patent Number: 4,591,890
[45] Date of Patent: May 27, 1986

[54] RADIATION HARD MOS DEVICES AND METHODS FOR THE MANUFACTURE THEREOF

[75] Inventors: Clarence A. Lund, Phoenix; Michael D. Sugino, Mesa, both of Ariz.

[73] Assignee: Motorola Inc., Schaumburg, Ill.

[21] Appl. No.: 450,869

[22] Filed: Dec. 20, 1982

[51] Int. Cl.⁴ .............................................. H01L 29/78
[52] U.S. Cl. ................. 357/23.11; 357/23.9; 357/50
[58] Field of Search ................. 357/23 CS, 23 S, 51, 357/50

[56] References Cited

U.S. PATENT DOCUMENTS

| | | | |
|---|---|---|---|
| 3,755,001 | 8/1973 | Kooi et al. | 357/23 CS |
| 3,783,047 | 1/1974 | Paffen et al. | 357/50 |
| 4,370,669 | 1/1983 | Donley | 357/51 |
| 4,404,579 | 9/1983 | Leuschner | 357/23 CS |

FOREIGN PATENT DOCUMENTS 52-65686 5/1977 Japan ............................. 357/23 CS
54-8475 1/1979 Japan ............................. 357/23 CS

OTHER PUBLICATIONS

"An Advanced, Radiation Hardened Bulk CMOS/LSI Technology", I.E.E.E. Transactions on Nuclear Science; vol. NS-28; No. 6; Dec. 81; Schroeder, et al, pp. 4033-4037.

Primary Examiner—Martin H. Edlow
Assistant Examiner—Andrew J. Telesz, Jr.
Attorney, Agent, or Firm—Jonathan P. Meyer

[57] ABSTRACT

Radiation hard, N-channel MOS devices comprising active regions surrounded by field oxide protected by an underlying region of heavily doped p-type material. The guard region is doped heavily enough to provide field inversion voltages in the range of 50 V to 60 V prior to irradiation. The guard region is separated from the source and drain regions to provide acceptably high breakdown voltages. The devices are produced with minor variations to well known, high density local oxidation of silicon-type processes.

4 Claims, 18 Drawing Figures

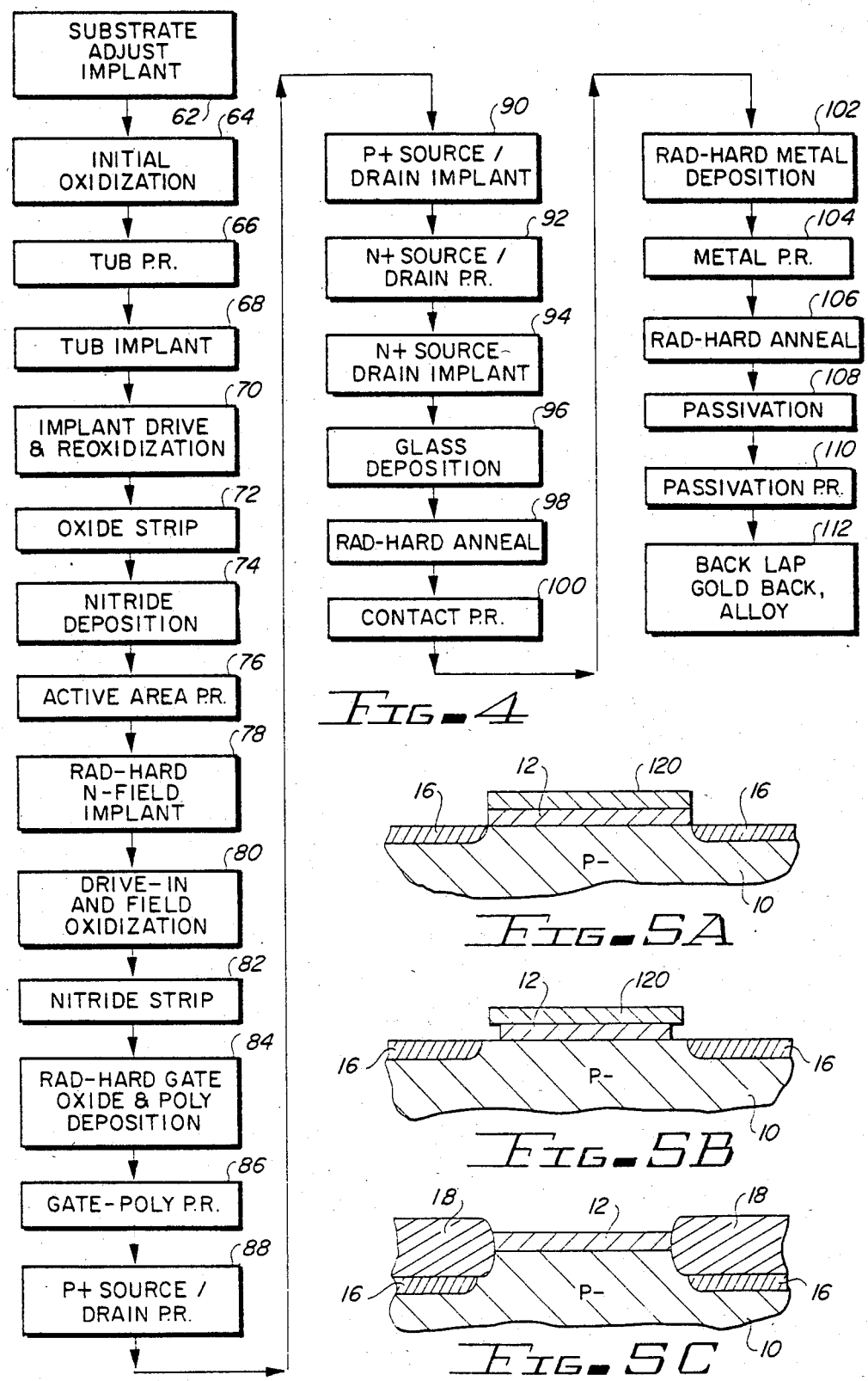

4,591,890

RADIATION HARD MOS DEVICES AND METHODS FOR THE MANUFACTURE THEREOF

FIELD OF THE INVENTION

The present invention relates, in general, to radiation hardened MOS devices More particularly, the invention relates to variations on a local oxidation of silicon process for the manufacture of high density, radiation hard MOS circuits.

BACKGROUND OF THE INVENTION

Due to the well known power advantages of MOS integrated circuits, they are a natural choice for certain applications such as space satellites. However, in this and other high radiation dose environments, MOS devices must be specially protected, or radiation hardened, to avoid radiation-induced failure.

The most troublesome mechanism of radiation damage involves the buildup of positive charge in the field oxide near the Si—SiO$_2$ interface. This charge does not interfere with the performance of P-channel devices, but in N-channel devices it causes an inversion of the substrate or tub surrounding the active regions, providing an unwanted current path.

Well developed techniques exist for growing radiation hard gate oxide, in which control of positive charge accumulation is possible due to the relatively thin layer of oxide needed. The thick field oxide surrounding the active region, however, is not susceptible to these methods of radiation hardening because it is too thick. Therefore, techniques have evolved for increasing the doping level of the customary p-type guard region surrounding each N-channel device to preclude the possibility that radiation-induced inversion layers will extend between two devices under the field oxide.

When this technique is applied to high-density processes referred to as local oxidation of silicon processes, the heavily doped, p-type guard region abuts the n-type source and drain regions, resulting in a drain-to-substrate breakdown voltage which is unacceptably low.

SUMMARY OF THE INVENTION

Accordingly, it is an object of the present invention to provide improved, radiation hard MOS devices.

It is a further object of the present invention to provide a local oxidation of silicon process capable of producing radiation hard MOS devices.

A particular embodiment of the present invention comprises an N-channel, silicon-gate MOS device useful in either CMOS or NMOS circuits. The device is manufactured by a slightly modified local oxidation of silicon process, thus providing high circuit density and a well known process flow. The source and drain regions are pulled back approximately 9 microns from the edge of the active region, providing a breakdown voltage greater than 12 volts. A unique gate topography is used to allow gate contact over thick oxide while preventing the polysilicon doping diffusion from encroaching on the undiffused guard region. Acceptable circuit performance above 10$^5$ Rad integrated dose has been achieved.

An alternate embodiment of the present invention comprises another N-channel, MOS device which is also manufactured according to a local oxidation of silicon process. The nitride layer used to mask the guard region implant is cut back prior to being used to mask the field oxide growth. The subsequent process flow is entirely conventional. This provides the separation of the N+ and P+ regions necessary to keep the breakdown voltage high, while providing high density and minimum process variation.

These and other objects and advantages of the present invention will be apparent to one skilled in the art from the detailed description below taken together with the drawings.

BRIEF DESCRIPTION OF THE DRAWINGS

FIG. 4 is a flow chart illustrating a complete radiation hard CMOS process flow according to the principles of the present invention; and FIGS. 5A through 5C are cross-sectional views of a portion of an MOS integrated circuit illustrating a variation of the local oxidation of silicon process used to produce devices according to an alternate embodiment of the present invention.

DETAILED DESCRIPTION OF THE INVENTION

FIGS. 1A–1E are cross-sectional views illustrating various steps in a conventional local oxidation of silicon process. Such processes are known by various names and embody many variations. A primary advantage of these processes is that the various structures of the finished device are largely self-aligned, thus allowing the production of high-density circuits. Local oxidation of silicon processes may be used to fabricate both CMOS and NMOS circuits. In the former case, each N-channel device is constructed on a p-type tub embedded in the n-type substrate, while in the latter case the entire substrate may be p-type. The following discussion will refer to the construction of N-channel devices in a p-type, or P−, base region and is intended to encompass both CMOS and NMOS processes. The particular radiation damage mechanism addressed by the present invention does not affect P-channel devices, so the discussion does not apply thereto except to the extent that a complete CMOS process flow is discussed.

Figure 1A:
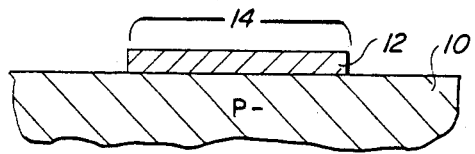
FIGS. 1A–1E are cross-sectional views of a portion of an MOS integrated circuit illustrating various stages in a conventional local oxidation of silicon process.

In FIG. 1A, a p-type base 10 with a relatively low dopant concentration, designated P−, has an area of nitride 12 overlying it. In a CMOS circuit, base 10 is a tub formed by the deposition and drive-in of a p-type dopant on an n-type substrate. Nitride layer 12 was originally formed over the entire surface of base 10. A photoresist and exposure mask are used to protect an area 14 of nitride 12. The remainder of nitride 12 is removed, defining what will eventually be an active area 14 of the device.

Figure 1B:
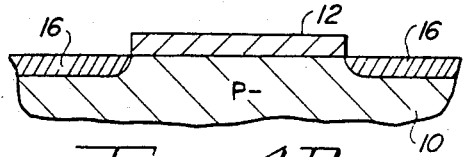

In FIG. 1B, a p-type dopant has been deposited over the entire surface. This may be accomplished either by chemical vapor deposition (CVD) or ion implantation. In a CMOS process flow, other areas of the circuit are protected from contact with the p-type dopant with a mask. Nitride 12 masks active area 14, leaving a P+ region 16 surrounding it. P+ region 16 is said to be self-aligned to active area 14 because the same mask (nitride 12) which defines active area 14 defines the inner edge of P+ region 16.

Figure 1C:
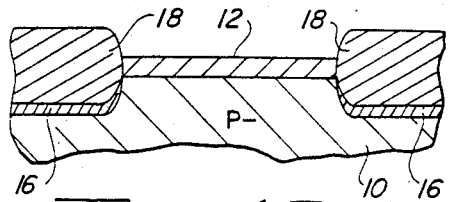

In FIG. 1C, a field oxide 18 has been grown over P+ region 16 by exposing the device to an oxidizing ambient. Field oxide 18 is also self-aligned to active area 14 by virtue of nitride 12. P+ region 16 extends around the lower edge of field oxide 18 and reaches the surface of base 10.

Figure 1D:
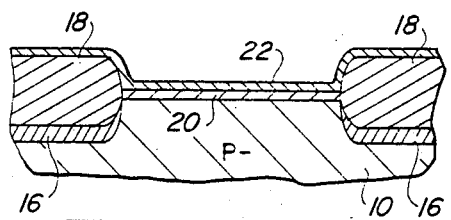

In FIG. 1D, nitride 12 has been removed and a thin, gate oxide 20 grown in its place overlying base 10. In addition, an undoped polysilicon layer 22 has been deposited over the entire surface of the device by chemical vapor deposition or the like.

Figure 1E:
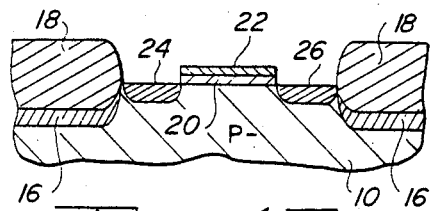
Figure 3G:
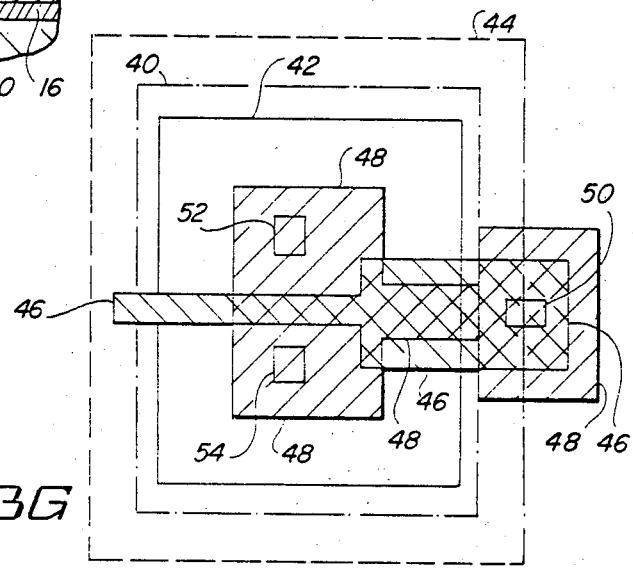
FIGS. 3A–3G illustrate the successive mask steps used in the process of FIGS. 2A and 2B.
Figure 3A:
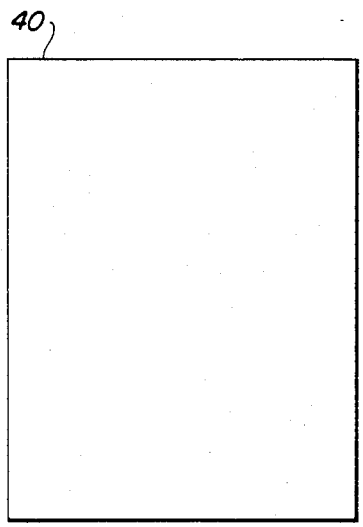
Figure 3B:
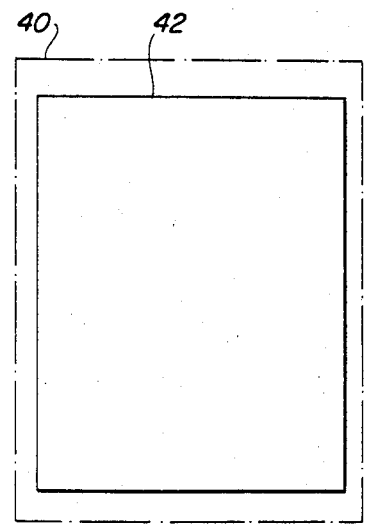
Figure 3C:
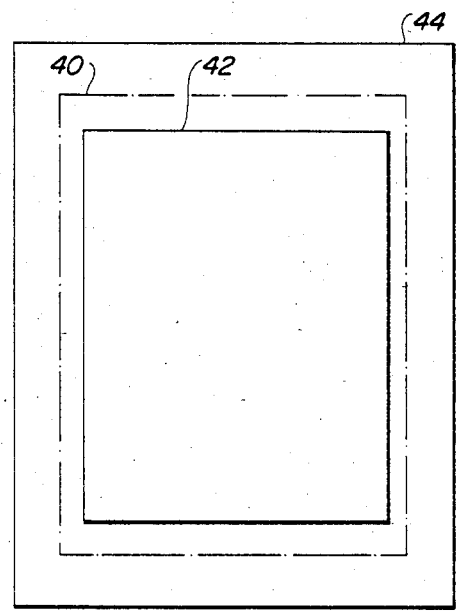
Figure 3D:
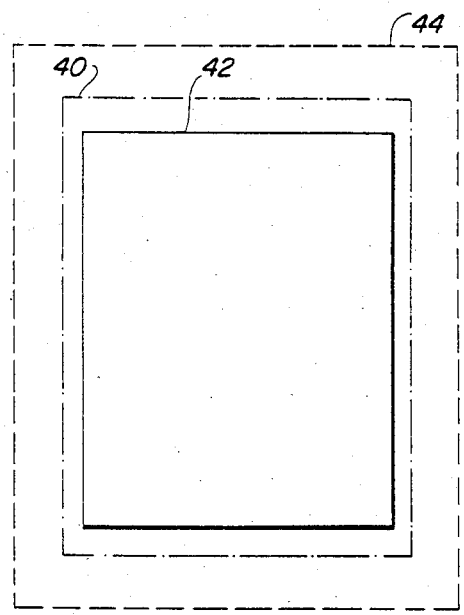
Figure 3E:
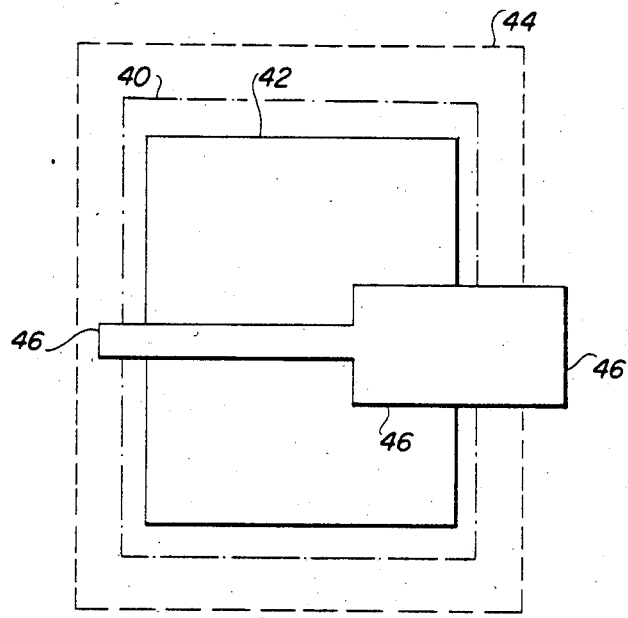
Figure 3F:
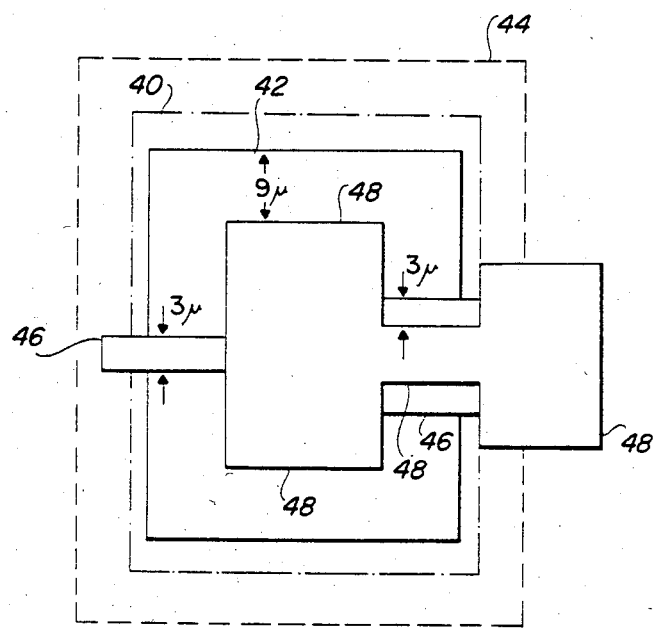

In FIG. 1E, gate oxide 20 and polysilicon 22 have been reduced to the dimensions shown by a photoresist-exposure mask-etch process. In addition, source 24 and drain 26 regions have been formed by deposition of an n-type dopant and a thermal drive-in step. Commonly, a mask slightly larger than active area 14 is used to avoid contamination of nearby areas with n-type dopant. Polysilicon 22 is left exposed, whereby it becomes doped and conductive. Because the adjacent structures, field oxide 18 and gate oxide 20, define the boundaries of the source 24 and drain 26 diffusions, the entire structure is self-aligned, which contributes to high circuit density.

The process described above is generalized and has many variations. In particular, the oxide thicknesses, dopant concentrations, and process details are subject to wide variation. Where those details are critical to the practice of the present invention, they are discussed below. In addition, many more steps such as glass deposition, contact forming and metalization are required before the device is useful. In a high dose radiation environment, such as is experienced in a space satellite, radiation-induced positive charge accumulates in field oxide 18 and gate oxide 20. As will be described below, it is possible to control this process in gate oxide 20, which is generally less than 1,000 angstroms thick. However, this is not possible in field oxide 18 which may be a micron or more in thickness. So the accumulation of positive charge forms a depletion region and eventually an inversion layer immediately under field oxide 18, creating an unwanted current path between the source 24 and drain 26 regions and other areas of the circuit. Of course, increasing the doping concentration of P+ region 16 will increase the amount of radiation damage which the device may sustain before the inversion layer forms. But due to the contact between the N+ source 24 and drain 26 regions and P+ region 16 such a high level of doping decreases the drain-to-substrate breakdown voltage to unacceptable levels.

Figure 2A:
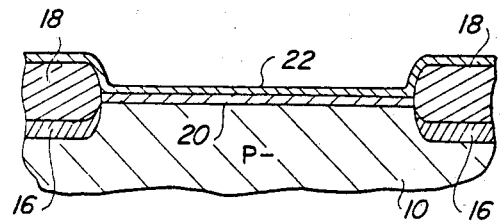
FIGS. 2A and 2B are cross-sectional views of a portion of an MOS integrated circuit illustrating a variation of the local oxidation of silicon process used to produce devices according to a preferred embodiment of the present invention.
Figure 2B:
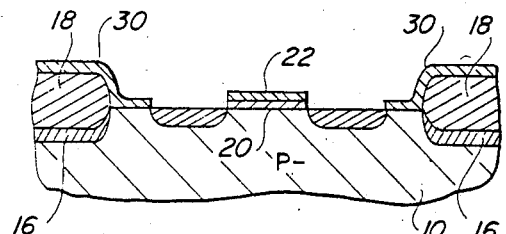

Referring now to FIGS. 2A and 2B, which are cross-sectional views of a portion of an MOS device according to a preferred embodiment of the present invention at two stages during fabrication, a variation of the local oxidation of silicon process is described. In FIG. 2A, a P− base region 10 may be either a p-type wafer or a p-type tub in an n-type substrate. By means of the process steps described with reference to FIGS. 1A through 1D, a P+ guard region 16 has been implanted surrounding the active area and a field oxide 18 grown over it. Guard region 16 is substantially coextensive with field oxide 18, as described above, due to the fact that both structures were fabricated using the nitride layer as a mask. This refers only to the region in the immediate vicinity of this device. As is apparent, field oxide 18 generally extends beyond the outer edge of P+ guard region 16. The prime design requirement is that the field inversion voltage, that voltage which, when applied between field oxide 18 and base region 10, inverts the region immediately beneath field oxide 18, be in the range of 50 V to 60 V prior to any irradiation of the device. A p-type dopant level in the range of $10^{19}$ to $10^{20}$ cm$^{-3}$ measured as a surface concentration while fabricating P+ guard region 16 and a field oxide 18 thickness of approximately 10,000 angstroms satisfy this requirement. This provides a field inversion voltage of approximately 30 V after a $10^5$ Rad integrated radiation dose and approximately 15 V after $3 \times 10^5$ Rad. These figures are provided merely by way of example and may be varied in the practice of the present invention.

Also present in FIG. 2A are a radiation hard gate oxide 20 and a polysilicon layer 22. One technique for growing a radiation hard gate oxide simply involves the use of a dry $O_2$ ambient. The resulting oxide is preferably on the order of 500-600 angstroms thick. To maintain the radiation hardness of such an oxide, subsequent annealing steps must be carried out at relatively low temperature: approximately 1,000 degrees C. or less. Other radiation hard gate oxide techniques may be substituted.

Referring now to FIG. 2B, radiation hard gate 20 and polysilicon layer 22 have been patterned to the desired configuration, as is described with reference to FIGS. 3A-3G below. As mentioned above, a mask 30 is customarily used when depositing the n-type dopant for the source and drain regions and the gate doping. Normally, this mask has an opening slightly larger than the active area and precise alignment is not crucial. In the preferred embodiment, mask 30, which is preferably a photoresist, is extended approximately 9 microns inward from the inner edge of field oxide 18 to cover the outer portion of the active area, as shown. As is apparent, while this step remains self-aligned to the gate, it is not self-aligned to the inner edge of the field oxide, making alignment important and sacrificing some density. In one example a density loss of 14% when compared to the conventional process of FIGS. 1A through 1E was encountered. After the application of mask 30, source 24 and drain 26 regions are fabricated and polysilicon 22 is doped by conventional dopant deposition and annealing steps. The 9 microns of separation between the source 24 and drain 26 regions and P+ guard region 16 which is afforded by this embodiment of the present invention provides the level of radiation hardness of the field oxide described above while maintaining sufficiently high breakdown voltages, approximately 12 V, to allow 7 V operation of the device. This high voltage operation is crucial if the circuit is to operate at high speeds, for example 15 MHz. As is apparent, the 9 micron figure mentioned above may be made larger or smaller, depending on the final device characteristic desired. In particular, this figure includes some degree of allowance for misalignment of mask 30. This allowance may be decreased as alignment techniques improve.

Setting the source 24 and drain 26 regions in from the edge of field oxide 18 presents a problem with gate topography if it is desired to make gate contact over thick oxide, as is common. The gate oxide and overlying doped polysilicon must extend across the undoped portion of the active area, but none of the dopant used to render the polysilicon conductive can be allowed to contaminate this guard region. FIGS. 3A-3G illustrate the problem and one solution. FIGS. 3A–3G are plan views illustrating the several mask steps used in a CMOS process according to the preferred embodiment of the present invention. The masks will be described in the order of their use in the process. Since this is a CMOS process, the first step is to create the P− tub in which to construct the device. This is accomplished with mask 40. Next, the nitride layer is deposited and patterned to cover the active area with mask 42. Next, the P+ guard region is implanted using the nitride as the inner edge mask and mask 44 as the outer edge mask. The field oxide is grown using only the nitride layer as a mask, although other areas of the circuit may be protected if necessary. As is apparent, the outer edge of the field oxide normally extends substantially beyond the outer edge of the P+ guard region, while the two inner edges coincide. Next, the radiation hard gate oxide and polysilicon layer are deposited and patterned with mask 46. The gate structure extends entirely across the active area and onto the field oxide at both sides thereof. At one end the gate structure is approximately 3 microns wide, while at the other it is much wider, approximately 10–12 microns wide. Next, mask 48 is used to apply the n-type dopant for the source and drain and gate doping. In the source and drain regions mask 48 is set in 9 microns from the edge of mask 42 to provide the separation necessary for a high breakdown voltage. Where the open area of mask 48 overlaps the wide portion of gate mask 46, mask 48 has an open strip along the gate structure to allow a continuous line of doped polysilicon. This strip is substantially narrower than the underlying gate structure, leaving approximately 3 microns on each side for a margin. This is to assure that none of the n-type dopant contaminates the undoped region of the active area in the vicinity of the inner edge of the P+ guard region. Once the strip is beyond the active area, mask 48 expands to beyond the dimensions of the gate structure to ensure doping of the contact region. Finally, after intermediate steps, gate contact 50, source contact 52 and drain contact 54 masks are used to provide contact between the various regions and the metalization to be applied later. While FIG. 3 presents one solution to the problem of gate topography when practicing the present invention, other solutions may be substituted.

Referring now to FIG. 4, a complete CMOS process flow used in manufacturing CMOS circuits including N-channel devices according to the present invention is shown in flow chart form. The details of many of the process steps are familiar in the art and are subject to wide variations. Initially, the conductivity of an n-type wafer is adjusted by means of a substrate adjust implant step 62, which is followed by an initial oxidation step 64. This oxide layer is patterned by means of a tub photoresist step 66 and is then used as a mask in a P− tub implant step 68. An implant drive and reoxidation step 70 follows and is followed by an oxide strip step 72. Next, a nitride deposition step 74 deposits a layer of nitride over the entire surface. The nitride layer is patterned so as to cover only the active areas by means of an active area photoresist step 76. The radiation hardening P+ guard region is implanted around the remaining nitride by means of a rad-hard N-field implant step 78, which is followed by a thermal drive-in and field oxidation step 80 by which the field oxide is grown. The range of ion dosages suitable for implant step 78 depends on the range of radiation dosages to be withstood and the field inversion voltage to be maintained. The field oxide thickness is normally in the range of 1 to 2 microns.

Once the radiation hardened field oxide is grown, a nitride strip step 82 is used to prepare for fabrication in the active area. The radiation hard gate oxide and polysilicon deposition step 84 follows and the proper gate topography is obtained by a gate-poly photoresist step 86. Areas to be protected from the p-type dopant are next covered by means of a P+ source/drain photoresist step 88, which is followed by a P+ source/drain implant step 90 which also acts to dope the P-channel gate polysilicon areas. Next, the N-channel source and drain regions are defined by an N+ source/drain photoresist step 92, which includes the separation and gate topography discussed above. The N-channel source and drain regions are created and the N-channel gates doped by an N+ source/drain implant step 94. A glass deposition step 96 follows. Next, a radiation hard anneal step 98, which is a low temperature anneal as described above, is performed. Contact areas are formed by a contact photoresist step 100, which is followed by a radiation hard metal deposition step 102. Several methods, such as filament evaporation, are available for radiation hard metal deposition. The object is to avoid surface damage. Preferred is a method in which metal contained in a crucible is heated by means of an E-beam and vapor deposited on the circuit. The desired metalization pattern is obtained by means of a metal photoresist step 104, which is followed by another radiation hard anneal step 106. Passivation 108 and passivation photoresist 110 steps follow. Finally, back lap, gold back and alloy steps 112 complete the process.

As is apparent, the process flow described above is only slightly different from the standard local oxidation of silicon process. The major impact is on the masks used, as was described with reference to FIG. 3.

An alternate embodiment of the present invention is described with reference to FIGS. 5A through 5C, which are cross-sectional views of a portion of an MOS device at several stages of fabrication. In FIG. 5A, which is analogous to FIG. 1B, a P− base region 10 has been covered by a patterned nitride layer 12, which has been used as a mask to implant a P+ guard region 16. In addition, a patterned oxide layer 120 of the same dimensions as nitride 12, overlies nitride 12. In fact, oxide layer 120, which may also be a photoresist layer, is the mask which was used to pattern nitride 12 so as to cover only the active area. In FIG. 5B, the device has been exposed to a nitride etching step which undercuts the edges of nitride 12. In general, the amount of separation between the outer edge of nitride 12 and the inner edge of P+ guard region 16 is less than would be obtainable with the preferred embodiment. However, in situations where only 1 micron or so separation is required, this embodiment offers much less modification of standard process flow. Finally, in FIG. 5C, oxide layer 120 has been removed and field oxide 18 has been grown self-aligned to active area nitride 12 in the conventional manner. Since P+ guard region 16 is already set back from the edge of field oxide 18, the rest of the standard local oxidation of silicon process may proceed without change. So while this embodiment of the invention provides less separation between the source and drain and P+ guard region 16, it remains totally self-aligned and is, therefore, more dense.

The discussion above describes silicon-gate MOS devices and processes, but the principles of the present invention may be extended to other devices and processes.

While the present invention has been particularly shown and described with reference to a preferred and an alternate embodiment thereof, it will be understood by those skilled in the art that various other modifications and changes may be made to the present invention without departing from the spirit and scope thereof.

We claim:

1. A radiation hard MOS device comprising:
   a p-type semiconductor base region;
   a field oxide overlying a portion of said base region, said field oxide surrounding an active area of said base region;
   a heavily doped p-type guard region underlying said field oxide;
   first and second n-type regions in said active area of said base region, outer edges of said first and second n-type regions being separated from an inner edge of said field oxide;
   a radiation hard gate oxide overlying said base region between said first and second n-type regions and extending over said field oxide; and
   a polysilicon layer overlying said gate oxide, a portion of said polysilicon layer being doped, a remainder of said polysilicon layer being undoped, said doped portion of said polysilicon layer being spaced from an edge of said gate oxide in a region between said n-type regions and said field oxide.

2. A radiation hard MOS device according to claim 1 wherein:
   said first and second n-type regions are separated from said field oxide by approximately nine microns.

3. A radiation hard MOS device according to claim 1 wherein:
   said doped portion of said polysilicon layer be spaced from an edge of said gate oxide in said region between said n-type regions and said field oxide by approximately 3 microns.

4. A radiation hard MOS device according to claim 1 wherein:
   said p-type guard region is doped to a surface concentration in the range of approximately $10^{19}$ to $10^{22}$ per cubic centimeter.

* * * * *